(12) United States Patent
Ogier et al.

(10) Patent No.: US 10,090,482 B2
(45) Date of Patent: Oct. 2, 2018

(54) TRANSISTORS

(75) Inventors: Simon Ogier, Ripon (GB); Marco Palumbo, Liverpool (GB)

(73) Assignee: CPI Innovation Services Limited, Redcar (GB)

( * ) Notice: Subject to any disclaimer, the term of this patent is extended or adjusted under 35 U.S.C. 154(b) by 49 days.

(21) Appl. No.: 14/112,157

(22) PCT Filed: Apr. 20, 2012

(86) PCT No.: PCT/GB2012/050869
§ 371 (c)(1),
(2), (4) Date: Nov. 21, 2013

(87) PCT Pub. No.: WO2012/143727
PCT Pub. Date: Oct. 26, 2012

(65) Prior Publication Data
US 2014/0097426 A1 Apr. 10, 2014

(30) Foreign Application Priority Data

Apr. 21, 2011 (GB) .................................. 1106772.5

(51) Int. Cl.
*H01L 51/10* (2006.01)
*H01L 51/05* (2006.01)

(52) U.S. Cl.
CPC ........ *H01L 51/105* (2013.01); *H01L 51/0512* (2013.01); *H01L 51/0566* (2013.01); *H01L 51/102* (2013.01); *H01L 51/0558* (2013.01)

(58) Field of Classification Search
USPC ..... 257/40, 57, E21.025, E51.006, E51.005, 257/E51.024, E51.002; 438/99, 151;
(Continued)

(56) References Cited

U.S. PATENT DOCUMENTS

2003/0122120 A1  7/2003  Brazis et al.
2006/0197884 A1* 9/2006  Kim ...................... H01L 27/307
                                                    349/43
(Continued)

FOREIGN PATENT DOCUMENTS

EP    1780815 A2 *  5/2007  ............. H01L 51/00
EP    1780815 A2    5/2007
(Continued)

OTHER PUBLICATIONS

Anthony, John E. et al., "Functionalized Pentacene: Improved Electronic Properties from Control of Solid-State Order", J. Am. Chem. Soc., 2001, 123, pp. 9482-9483.
(Continued)

*Primary Examiner* — Fernando L Toledo
*Assistant Examiner* — Lawrence-Linh T Nguyen
(74) *Attorney, Agent, or Firm* — Winstead PC

(57) ABSTRACT

This invention comprises a field effect transistor which comprises source and drain electrodes (01) which are bridged by a semiconductor which comprises semiconducting crystallites, the conductivity of the semiconductor being controlled by a gate electrode (02) which is insulated from the semiconductor and the source and drain electrodes, to which a potential is applied for controlling the conductivity of the semiconductor, in which at least part of the facing surfaces of the source and drain electrodes are geometrically formed such that they provide current flow of different directions between the electrodes through the said channel. By this means current is caused to flow through more orientations of the crystals resulting in greater uniformity of performance between different transistors when there is a degree of variable crystallographic orientation.

11 Claims, 1 Drawing Sheet

(A) "Wavy" transistor W=163 microns (B) "Wavy" transistor W=100 microns (C) "Linear" transistor

(58) Field of Classification Search
 USPC .......................................................... 349/43
 See application file for complete search history.

(56) References Cited

U.S. PATENT DOCUMENTS

| | | |
|---|---|---|
| 2007/0131927 A1 | 6/2007 | Kawakami et al. |
| 2007/0252229 A1 | 11/2007 | Fujimori et al. |
| 2010/0155710 A1* | 6/2010 | Lee et al. ........................ 257/40 |
| 2010/0308304 A1* | 12/2010 | Ogier et al. .................... 257/40 |
| 2012/0199821 A1 | 8/2012 | Gwoziecki et al. |

FOREIGN PATENT DOCUMENTS

| | | |
|---|---|---|
| EP | 1850404 A2 | 10/2007 |
| JP | 2005260216 A | 9/2005 |
| JP | 2006313913 A | 11/2006 |
| JP | 2007123773 A | 5/2007 |
| JP | 2007294704 A | 11/2007 |
| JP | 2008108874 A | 5/2008 |
| JP | 2009105308 A | 5/2009 |
| JP | 2009524226 A | 6/2009 |
| JP | 2010153794 A | 7/2010 |
| JP | 2013507012 A | 2/2013 |
| WO | WO-03058729 A1 | 7/2003 |

OTHER PUBLICATIONS

Beierlein, Udo, "International Search Report," prepared for PCT/GB2012/050869, dated Jul. 31, 2012, 5 pages.

* cited by examiner

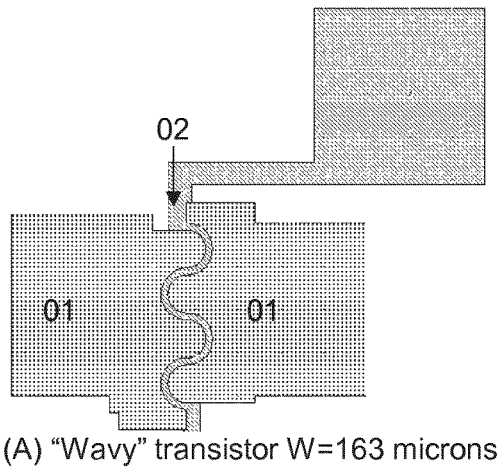
(A) "Wavy" transistor W=163 microns
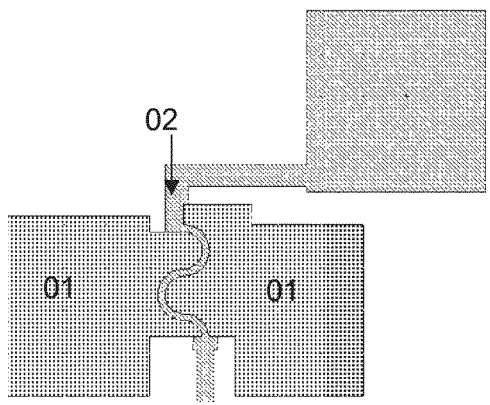
(B) "Wavy" transistor W=100 microns
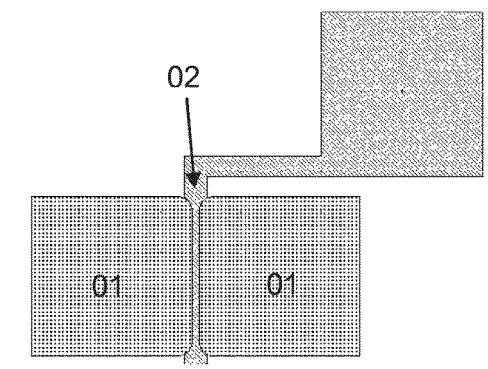
LINEAR; W=100 microns
(C) "Linear" transistor

TRANSISTORS

This invention relates to transistors.

BACKGROUND OF THE INVENTION

Field effect transistors are known in which source and drain electrodes are bridged by a semiconductor the conductivity of which is controlled by a gate electrode insulated from the semiconductor and the source and drain electrodes to which a potential is applied for this purpose.

In order to meet performance specifications it is necessary for such devices to be acceptably consistent in their performance. This is particularly important in display devices containing many transistors in which inconsistent performance can show as defects in the display.

US 2010/0155710 discloses the process of forming well oriented crystals by isotropic growth and the large crystals of the semiconductor in the channel between the source and drain electrodes appear in the photographs to bridge the channel. This is achieved by depositing a drop of water on its drain electrode and depositing an immiscible solution of a semiconductor on to the drop of water which solution flows over the water droplet into a surrounding channel between drain electrode and the source electrode. The channel seems necessarily to surround the drain electrode but this is difficult to reconcile with some of the drawings and with the photograph of FIG. 9 in which the source and drain electrodes are said to be square shaped.

The procedure seems to have been carried out on a small scale using pipettes or the like and the channels were 200 µm long in the direction of current flow. There are difficulties in scale up to industrial production and in dealing with the short channel lengths of as little as 4 µm now being adopted.

Problems mentioned as requiring attention in the specification include liquid amounts, liquid viscosity, liquid evaporation rates, drop height, drop angle, drop atmosphere, drop splash etc. The problem of delivering droplets onto very tiny targets and then delivering second droplets onto the top of the first droplet are believed to be beyond the practicality of presently known equipment. The problem of preventing variations in the size of the droplets impacting the target and other difficulties are likely to introduce non-uniformity in transistors. The process described appears to be of great difficulty and there is a need for a simpler process of producing transistors of closely reproducible performance on a large scale.

A further problem with the products of this process is that a substantial part of the drain electrode would not be covered by the semiconductor although the degree to which this would be the case would presumably depend on the extent to which the impact of the semiconductor solution splashed or spread the water over the surface. If the water spread into the channel as a result the semiconductor would presumably not fill the channel and its evaporation might damage the connection.

This invention enables the large-scale production of transistors of satisfactorily uniformity of properties by a simpler procedure using semiconductors in which the crystallites do not have to be well oriented.

In WO 03/058729 semiconductor devices are described in which the channel separating the source and drain electrodes is extended by adopting what is described as a non-linear formation. In most of the drawings the non-linear channels are composed of connected linear sections and no curvature is present. Such an arrangement can achieve close packing in which the width of the channel can be maximised. In accordance with the convention used in this art we define channel length as being the distance between source and drain electrodes and channel width to be the geometrical extent of the said channel.

There is no teaching relating to the crystalline nature of the semiconductors or uniformity of performance of transistors, in this reference but in order to emphasise the generality the invention in FIG. 6 a serpentine configurations is shown. This appears to be a non-optimum use of the available space.

BRIEF DESCRIPTION OF THE DRAWING

FIG. 1 illustrates examples of patterns used to define source and drain electrodes in accordance with principles of the invention.

DESCRIPTION OF THE INVENTION

If the semiconductor is amorphous it will tend to be consistent with any orientation of the source and drain electrodes, but higher charge mobilities are being sought by the use of crystalline semiconductors which are in general not isotropic in their electrical characteristics.

Consequently if the semiconductor crystals are aligned in an optimum orientation relative to the path of current between the electrodes their performance is better than if their alignment is not optimal. In normal manufacturing procedures the direction of alignment cannot be controlled and the resulting transistors may be of unpredictable performance when manufactured by the same technique. For crystals much smaller than the device channel length, if the orientation of the crystals relative to the path of the current is completely random although the performance of the device will not be optimum each example of the device will have a similar performance. In view of the constant pressure to reduce the size of transistors one will nonetheless find that as the numbers of crystals relative to the channel length declines then localised areas of different average alignment will arise.

Insofar as the crystalline semiconducting material is a single crystal it is fully aligned but not necessarily in the best orientation. If it comprises a large number of crystals it is likely that the crystals will be substantially random in their orientation. If this is not so the average orientation will differ from one device to another and if as is normal the conductivity of the crystals is non-isotropic the performance of the devices will be non-uniform. The shorter the channel length the fewer crystals will bridge it (assuming similar crystal size) and the greater the variation in charge mobility is likely to be.

The semiconductor may be organic or inorganic. It may comprise a single crystalline component which may be a small molecule component or may be a polymeric component which has crystalline and optionally amorphous regions. It may comprise both a crystalline small molecule semiconductor and a binder which may also be a semiconductor. In the latter case crystallites of the small molecule component may be present in a matrix of the binder or may to a greater or lesser extent segregate as a film in the conducting channel thus connecting the electrodes.

If the semiconductor is deposited from solution followed by evaporation of the solvent, crystals formed by the small molecules may be differently aligned by crystal growth phenomena in different channels. If crystal forming semiconducting small molecules are deposited by vapour deposition different alignment in different channels may also be brought about by crystal growth phenomena. If crystalline material is present as particles dispersed in a matrix and the ratio of the average crystal size to the length of the conducting channel is low and there are a large number of crystals present their orientation may approach randomness but if the average crystal size relative to the length of the conducting channel is high for example greater than one quarter, i.e. a ratio of 1 or more to 4 (expressed as the shortest distance from the source to the drain electrode) the uniformity of alignment is more likely to vary from location to location.

There is a trend to reduce the dimensions of field effect transistors and this necessarily brings the source and drain electrodes closer together. As fewer crystallites bridge the gap a variation of performance between different transistors can arise as some regions of crystallites will conform more to the optimum orientation for current flow than others.

This invention comprises a field effect transistor which comprises source and drain electrodes which are bridged by a semiconductor which comprises semiconducting crystallites of varying alignment, the conductivity of the semiconductor being controlled by a gate electrode, which is insulated from the semiconductor and the source and drain electrodes, to which a potential is applied for controlling the conductivity of the semiconductor, in which at least part of the facing surfaces of the source and drain electrodes are geometrically formed such that they provide current flow of different directions between the electrodes through the said channel. By this means current is caused to flow through more orientations of the crystals resulting in greater uniformity of performance between different transistors.

It will be realised that the invention produces the greatest benefit in improving the uniformity of performance of field effect transistors in which the crystallites tend to have a high degree of varying crystallographic alignment, but benefit may also be obtained to a lesser extent when the degree of crystallographic alignment is less.

The invention also provides a method of improving the uniformity of performance of field effect transistors which comprise semiconductors which comprise semiconducting crystallites bridging their source and drain electrodes by the use of source and drain electrodes of which the facing surfaces are contoured so as to have variable tangents.

It is preferred that the electrodes' facing surfaces should be complimentary so that the channel between them is similar in width throughout. The channel is preferably curved throughout its width. If the channel is circular the current will flow in different directions as the inner electrode will have a shorter circumference than the outer one and the current will flow in a fan like pattern. However a circular channel may cause manufacturing difficulties in that the inner electrode has to be accessed through a via and as this can complicate the manufacturing process we prefer open channels, for example a split circle formation in which alternately inverted semicircles are present or by a sinusoidal or similar form, for example connected and alternately inverted sections of the of conics, for example sections of parabolas or ellipses.

The channel should preferably be smooth and substantially free from discontinuities. The facing surfaces are preferably of matching conformation. The length of the channel between them is preferably substantially constant. It is preferred that the geometrical environment of the semiconductor should vary along the whole width of the channel.

The invention is of increasing advantage as the separation of the source and drain electrodes is reduced and it is very useful if the separation is less than 20 microns. It is particularly useful if the separation is at most 10 microns, for example at most 4 microns.

The invention is particularly suitable if the individual crystallites are large enough to be capable of bridging the gap between the electrodes or are approaching such size.

It is preferred that the semiconductor comprises a binder which is preferably amorphous and which is itself preferably a semiconductor. Both crystalline and amorphous semiconductors are well established in the art and a combination of a crystalline semiconductor, for example a polyacene, for example a pentacene which is preferably substituted by trialkylsilyl ethynyl groups and an amorphous semiconductor for example a polytriarylamine is suitable. The invention is believed however to be of a fundamentally physical character related to the orientation of semiconducting crystals as before discussed rather than being related to any particular crystals or any particular location thereof, whether for example present as a film bridging the channel or preferably as a matrix.

One form of the invention will now be described with reference to the drawings in which the source and drain electrodes are identified as 01 and the gate electrode is shown as 02. The shaped transistor source, drain and gate electrodes are shown in bottom gate configuration to show the channel shape in detail. The preparation of the transistors and their performance is described in the experimental results below.

Experimental Results

To investigate the effect of the Source and Drain (SD) electrode shape on the spread of drive currents in Organic Thin Film Transistors (OTFT), top gate bottom contact transistors were fabricated. In the experiments a range of different 4" square substrates were used. These were glass, planarised polyethylenenaphthalate (PEN) (ex Du Pont Teijin Films), and glass coated with a layer of crosslinked SU8 negative photoresist (Microchem corp). Au source and drain electrodes were defined upon the substrate using standard photolithography and chemical wet etching. For the PEN and glass substrates a thin (5 nm) Titanium adhesion layer was used underneath the Au. For the SU8 on glass substrate, the Ti adhesion layer was unnecessary since Au adheres well enough to the SU8 surface throughout the patterning process. The patterns used to define the source and drain electrodes can be seen in FIG. 1. Each 4" panel is divided in 32 unit cells distributed on the panel across 8 columns and 4 rows. In each cell there are up to 500 OTFTs (organic thin film transistors) and age shall show the packed in a density similar to that found in a display backplane of resolution 100 ppi (pixels per inch). Prior to spin coating of the OSC solution, a 10 mM solution of pentafluorobenzenethiol was applied to the surface of the electrodes for 1 minute followed by spin coating and rinsing in 2-propanol. Organic semiconductor (OSC) formulations comprised 6,13-bis(triisopropylenethylnyl)pentacene, (TIPS)[1] and polytriarylamine (PTAA)[2] in 1,2,3,4,-tetrahydronaphthalene solvent (tetralin). Several formulations were prepared in order to determine the influence of the electrode shape on the uniformity of the transistor on current. Details of the formulations used are shown in Table 1. To complete the OTFT stack a fluoropolymer dielectric (Cytop™ in FC43 solvent, Asahi Glass Company) was also spin coated to a thickness of 500 nm. Finally, Au top gates were deposited and patterned on top the stack via sputtering and photo-lithographic methods, allowing the precise positioning of the gate over the source-drain electrodes and OTFT channel.

Electrical characterization was performed using a Keithley 4200 semiconductor parameter analyser connected to a Wentworth semi-automatic probe station. For each formulation and electrode shape tested, a minimum of 50 transistors were measured at different points across the substrate. All OTFT were tested using a gate voltage, $V_G$ range of +20V to −40 V, while applying a constant drain voltage, $V_{DS}$ of −5 V (source grounded) and measuring the corresponding drain current, $I_{DS}$ transfer curve. The linear mobility, $\mu_{lin}$ of each transistor was calculated according the equation:

$$\mu = \frac{\partial I_{DS}}{\partial V_G} \frac{L}{WC_i V_{DS}}$$

where L is the transistor length, W is the transistor width and $C_i$ is the dielectric capacitance per unit area. On current was defined as the current measured for each transistor at a value of $V_{gs}=-40V$ and $V_{ds}=-5V$. To exclude the small proportion of devices with gate leakage, a ratio of the gate current to the source-drain current was made at the voltage of $V_{gs}$ −40V, $V_{ds}$ −5V. If this ratio was below 10 (i.e. the gate current was more than 10% of the source drain current, then the device was excluded from the results). Table 1 shows a summary of the main results obtained on 3 substrate types, using formulations at various PTAA:TIPS mixing ratios and with either linear or wavy electrode shape. A 4 wt % formulation of PTAA in tetralin was used as to demonstrate that shaped electrodes are only effective where the OSC layer is crystalline (PTAA is amorphous therefore unaffected by the channel orientation). In all cases where TIPS is used the standard deviation of the on current is substantially smaller when the wavy transistor shape is used. In many cases the standard deviation is less than half that of the linear shaped transistor. For the amorphous PTAA material the variation in on current is equal in both wavy and linear transistors (to within experimental error). The best $I_{on}$ variation for the TIPS/PTAA result (8.9%) on the wavy shaped electrodes is approaching the value for the PTAA case (5.2%).

TABLE 1

Summary of results.

| Formulation | L(μm)/W(μm) | Substrate type | Electrode shape | % standard deviation $I_{on}$ |
|---|---|---|---|---|
| TIPS:PTAA 4 wt % 1:1 | 8/100 | PEN | LINEAR | 29* |
| TIPS:PTAA 4 wt % 1:1 | 8/163 | PEN | WAVY | 8.9* |
| TIPS:PTAA 4 wt % 1:1 | 7/100 | SU8 | LINEAR | 21 |
| TIPS:PTAA 4 wt % 1:1 | 7/100 | SU8 | WAVY | 10 |
| TIPS:PTAA 4 wt % 2:1 | 8/100 | PEN | LINEAR | 35 |
| TIPS:PTAA 4 wt % 2:1 | 8/163 | PEN | WAVY | 16 |
| PTAA 4 wt % | 8/100 | Glass | LINEAR | 5.8 |
| PTAA 4 wt % | 8/163 | Glass | WAVY | 5.2 |

Note:
Linear mobility was unaffected by channel shape. For reference, the calculation of the linear mobility for the devices measured in table 1 is shown below:
For TIPS:PTAA 1:1 formulations the average linear mobility on PEN was 0.7 cm$^2$/Vs
For TIPS:PTAA 1:1 formulations the average linear mobility on SU8 (on glass) was 0.4 cm$^2$/Vs
For TIPS:PTAA 2:1 formulations the average linear mobility on PEN was 0.3 cm$^2$/Vs
For PTAA the average linear mobility on glass was 0.003 cm$^2$/Vs
*For this condition more than 300 OTFTs were tested across the substrate in groups of 100.

The invention claimed is:

1. A field effect transistor comprising:
   source and drain electrodes which source and drain electrodes are separated by a channel containing a semiconductor a conductivity of the semiconductor being controlled by a gate electrode to which gate electrode a potential is applied for controlling the conductivity of the semiconductor the gate electrode being insulated from the semiconductor and the source and drain electrodes;
   wherein the semiconductor comprises semiconducting crystals which semiconducting crystals are non-isotropic in their conductivity and are of varying alignment relative to the source and drain electrodes;
   wherein at least part of at least one facing surface of the source and drain electrodes is geometrically formed such that the at least one facing surface provides current flow of different directions between the source and drain electrodes through the channel; and
   wherein the channel is of split circle formation in which split circle formation connected alternately inverted circles are present.

2. The field effect transistor according to claim 1, wherein the channel separating the source and drain electrodes is of substantially uniform length and is curved throughout a width of the channel.

3. The field effect transistor according to claim 1, wherein the at least one facing surface of the source and drain electrodes is contoured so as to have variable tangents.

4. The field effect transistor according to claim 1, wherein a length of the channel is at most 20 μm.

5. A field effect transistor comprising
   source and drain electrodes which source and drain electrodes are separated by a channel containing a semiconductor a conductivity of the semiconductor being controlled by a gate electrode to which gate electrode a potential is applied for controlling the conductivity of the semiconductor the gate electrode being insulated from the semiconductor and the source and drain electrodes;
   wherein the semiconductor comprises a binder and semiconducting crystals which semiconducting crystals are non-isotropic in their conductivity and are of varying alignment relative to the source and drain electrodes;
   wherein at least part of at least one facing surface of the source and drain electrodes is geometrically formed such that at least one facing surface provides current flow of different directions between the source and drain electrodes;
   wherein the binder has semiconducting properties and is amorphous; and
   wherein the channel is of split circle formation in which split circle formation connected alternately inverted circles are present.

6. The field effect transistor as claimed in claim 5, in which the semiconductor comprises a polytriarylamine binder.

7. The field effect transistor as claimed in claim 5, wherein one source or drain electrode does not surround another.

8. A process of producing a field effect transistor as claimed in claim 1, wherein the semiconductor is deposited as a solution and dried.

9. The field effect transistor as claimed in claim 5, wherein a length of the channel is at most 10 μm.

10. The field effect transistor as claimed in claim 1, wherein one source or drain electrode does not surround the other.

11. The field effect transistor as claimed in claim 5, wherein the semiconductor comprises crystallites of a preferably substituted polyacene, for example a pentacene which is preferably substituted by trialkylsilyl ethynyl groups.

* * * * *